(12) United States Patent
Lee

(10) Patent No.: US 9,865,683 B2
(45) Date of Patent: Jan. 9, 2018

(54) ELECTRONIC DEVICE HAVING A TRANSISTOR WITH INCREASED CONTACT AREA AND METHOD FOR FABRICATING THE SAME

(71) Applicant: SK hynix Inc., Icheon-Si (KR)

(72) Inventor: Hyung-Suk Lee, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 56 days.

(21) Appl. No.: 14/588,849

(22) Filed: Jan. 2, 2015

(65) Prior Publication Data
US 2016/0079363 A1 Mar. 17, 2016

(30) Foreign Application Priority Data
Sep. 11, 2014 (KR) ........................ 10-2014-0120049

(51) Int. Cl.
| | |
|---|---|
| *H01L 29/76* | (2006.01) |
| *H01L 29/08* | (2006.01) |
| *H01L 29/423* | (2006.01) |
| *H01L 27/22* | (2006.01) |
| *G06F 3/06* | (2006.01) |
| *G06F 12/0866* | (2016.01) |
| *H01L 29/66* | (2006.01) |
| *H01L 29/417* | (2006.01) |
| *H01L 29/10* | (2006.01) |

(Continued)

(52) U.S. Cl.
CPC ........ *H01L 29/0847* (2013.01); *G06F 3/0604* (2013.01); *G06F 3/0629* (2013.01); *G06F 3/0679* (2013.01); *G06F 12/0866* (2013.01); *H01L 27/228* (2013.01); *H01L 27/2436* (2013.01); *H01L 29/1037* (2013.01); *H01L 29/41783* (2013.01); *H01L 29/4236* (2013.01); *H01L 29/66621* (2013.01); *H01L 45/04* (2013.01); *H01L 45/06* (2013.01); *H01L 45/1233* (2013.01); *H01L 45/141* (2013.01); *H01L 45/146* (2013.01); *H01L 45/147* (2013.01); *G06F 2212/222* (2013.01)

(58) Field of Classification Search
CPC ........... H01L 29/1037; H01L 29/41766; H01L 29/42356; H01L 29/4236; H01L 29/7813; H01L 29/66621; H01L 29/41738
See application file for complete search history.

(56) References Cited

U.S. PATENT DOCUMENTS

| | | | | |
|---|---|---|---|---|
| 2007/0132057 | A1* | 6/2007 | Curello | ............ H01L 21/26506 |
| | | | | 257/510 |
| 2008/0308879 | A1* | 12/2008 | Zhu | ................... H01L 21/28518 |
| | | | | 257/384 |

(Continued)

FOREIGN PATENT DOCUMENTS

KR  10-2014-0086647 A  7/2013

*Primary Examiner* — Jesse Y Miyoshi
(74) *Attorney, Agent, or Firm* — Perkins Coie LLP

(57) ABSTRACT

An electronic device includes a semiconductor memory unit that includes: a gate including at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate and under the recess; and a contact pad formed in the recess.

20 Claims, 9 Drawing Sheets

(51) Int. Cl.
 *H01L 45/00* (2006.01)
 *H01L 27/24* (2006.01)

(56) References Cited

U.S. PATENT DOCUMENTS

| | | | |
|---|---|---|---|
| 2009/0315120 A1* | 12/2009 | Shifren | H01L 29/7834 257/386 |
| 2011/0267876 A1* | 11/2011 | Min | G11C 8/12 365/163 |
| 2012/0025282 A1* | 2/2012 | Doris | H01L 21/823418 257/296 |
| 2012/0025283 A1 | 2/2012 | Son et al. | |
| 2012/0211813 A1* | 8/2012 | Taketani | H01L 27/10814 257/296 |

\* cited by examiner

ELECTRONIC DEVICE HAVING A TRANSISTOR WITH INCREASED CONTACT AREA AND METHOD FOR FABRICATING THE SAME

CROSS-REFERENCE TO RELATED APPLICATIONS

This patent document claims priority and benefits of Korean Patent Application No. 10-2014-0120049, entitled "TRANSISTOR, ELECTRONIC DEVICE HAVING TRANSISTOR AND METHOD FOR FABRICATING THE SAME" and filed on Sep. 11, 2014, which is incorporated herein by reference in its entirety.

BACKGROUND

This patent document relates to memory circuits or devices and their applications in electronic devices or system.

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such electronic devices have been conducted. Examples of such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device including a transistor with improved reliability, a semiconductor memory including the transistor, and a method for fabricating the same.

In one aspect, an electronic device is provided to include a semiconductor memory unit that includes: a gate including at least a portion buried in a substrate; a junction portion formed in the substrate on both sides of the gate; and a memory element coupled with the junction portion on one side of the gate, wherein the junction portion comprises: a recess having a bottom surface protruded in a pyramid shape; an impurity region formed in the substrate and under the recess; and a contact pad formed in the recess.

In some implementations, the junction portion may further include: an ohmic contact interposed between the impurity region and the contact pad. In some implementations, the gate may include: a trench that is formed in the substrate; a gate dielectric layer formed on a surface of the trench; a gate electrode that fills a portion of the trench over the gate dielectric layer; and a gate sealing layer that fills a remaining portion of the trench over the gate electrode. In some implementations, the impurity region may has an edge having a portion that overlaps with the gate electrode. In some implementations, the substrate may include a semiconductor substrate of a monocrystalline state, and the bottom surface of the recess may be free of a crystal plane having a greatest surface density in the surface. In some implementations, the substrate may include a monocrystalline silicon having a surface of a crystal plane of a (100) plane, and the crystal plane having the greatest surface density in the monocrystalline silicon is (111) plane. In some implementations, the impurity region may have a shape corresponding to a shape of the bottom surface of the recess, and have a predetermined thickness from the bottom surface of the recess. In some implementations, the impurity region may have a shape of a funnel. In some implementations, the semiconductor element may include a variable resistance element that switches between different resistance states according to a voltage or current applied to the variable resistance element. In some implementations, the variable resistance element may include a Magnetic Tunnel Junction (MTJ) where a tunnel barrier is interposed between two magnetic materials. In some implementations, the variable resistance element may include a metal oxide, a phase-change material, or a ferroelectric material.

In some implementations, the electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In another aspect, a transistor is provided to include: a substrate including a plurality of active regions, each active region including an upper portion that protrudes in a pyramid shape; gates each including at least a portion buried in the substrate and formed between the active regions; impurity regions each formed over the protruded upper portions of the active regions; and contact pads formed over the impurity regions.

In some implementations, the transistor may further include: ohmic contacts interposed between the contact pads and the impurity regions. In some implementations, each of the gates may include: a gate dielectric layer formed on a surface of each of trenches that are formed in the substrate and between the active regions; a gate electrode for gap-filling a portion of each trench over the gate dielectric layer; and a gate sealing layer for gap-filling a remaining portion of each trench over the gate electrode. In some implementations, the impurity region has an edge of which a portion overlaps with the gate electrode. In some implementations, the substrate may include a semiconductor substrate including a monocrystalline state, and the upper portions of the active regions are free of a crystal plane having the greatest surface density in the surface. In some implementations, the substrate may include a monocrystalline silicon having a surface of a crystal plane of a (100) plane, and the crystal plane having the greatest surface density in the monocrystalline silicon includes (111) plane. In some implementations, the impurity region may have a shape corresponding to a shape of the upper portions of the active regions, and has a predetermined thickness from the upper portions of the active regions. In some implementations, the impurity region may have a shape of a funnel.

In some implementations, the electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device is provided. The method includes: preparing a substrate including a monocrystalline state; forming a gate that includes at least a portion buried in the substrate; forming a recess in the substrate on both sides of the gate, the recess having a bottom surface protruded in a pyramid shape; forming an impurity region in the substrate and under the recess; and forming a contact pad that gap-fills the recess.

In some implementations, the method may further include: forming an ohmic contact on the bottom surface of the recess, before the forming of the contact pad. In some implementations, the forming of the gate may include: forming a trench by selectively etching the substrate; forming a gate dielectric layer on a surface of the trench; forming a gate electrode gap-filling a portion of the trench; and forming a gate sealing layer gap-filling a remaining portion of the trench over the gate electrode. In some implementations, the forming of the impurity region includes forming the impurity region such that a portion of an edge of the impurity region overlaps with the gate electrode. In some implementations, the impurity region may be formed by ion-implanting an impurity perpendicularly to the substrate. In some implementations, the forming of the recess may include: forming a first recess in the substrate; forming an amorphous region in the substrate under the first recess by performing a tilted ion implantation process; and forming a second recess to have the bottom surface protruded in a pyramid shape by removing the amorphous region. In some implementations, the amorphous region may include crystal planes having the greatest surface densities in the monocrystalline substrate. In some implementations, the crystal plane of the surface of the monocrystalline substrate may include a (100) plane, and the crystal planes having the greatest surface densities in the amorphous region include (111) planes.

Those and other aspects of the disclosed technology and their implementations and variations are described in greater detail in the drawings, the description and the claims.

DETAILED DESCRIPTION

Figure 1:
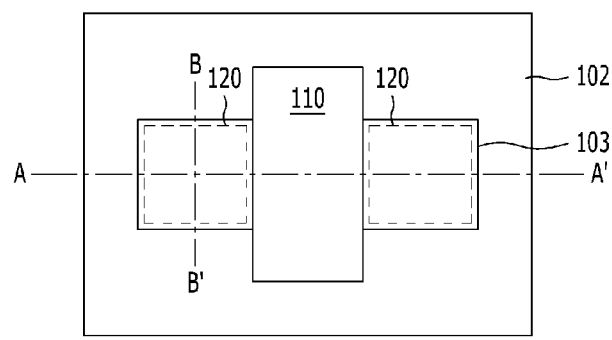
FIG. 1 is a plan view of a transistor in accordance with an implementation of the disclosed technology.

Various examples and implementations of the disclosed technology are described below in detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
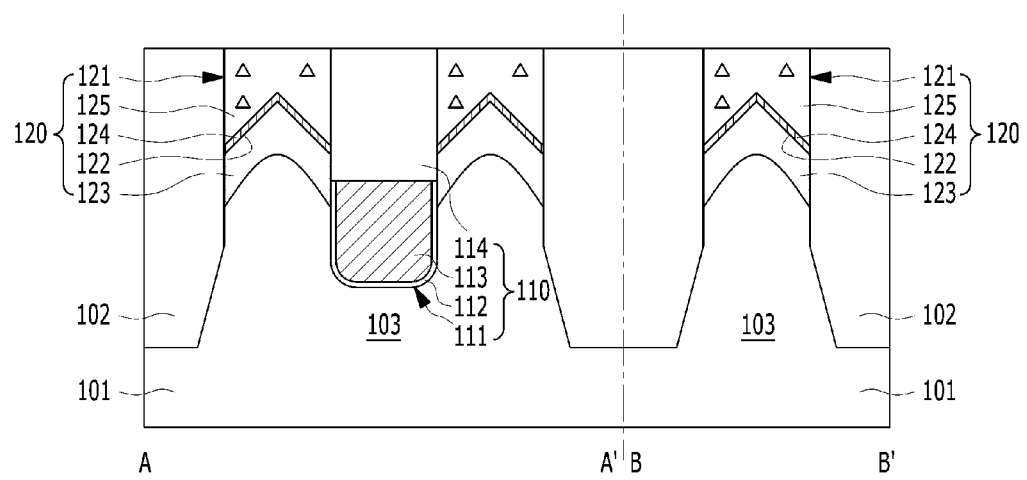
FIG. 2 is a cross-sectional view of the transistor in accordance with the implementation of the disclosed technology.

FIG. 1 is a plan view of a transistor in accordance with an implementation of the disclosed technology. FIG. 2 is a cross-sectional view of the transistor of FIG. 1 taken along an A-A' line and a B-B' line in accordance with the implementation of the disclosed technology. The A-A' line and the B-B' line intersects at the center of a junction portion 120, and the intersection of the A-A' line and the B-B' line corresponds to the apex of a pyramid structure including a bottom surface 122 of a recess 121.

Referring to FIGS. 1 and 2, the transistor in accordance with the implementation of the disclosed technology may include a buried gate 110 including at least a portion buried in a substrate 101, and the junction portion 120 formed in the substrate 101 on both sides of the buried gate 110. The junction portion 120 includes a source and a drain.

Hereafter, the elements of the transistor are described in detail.

The transistor in accordance with the implementation of the disclosed technology may include the substrate 101 of a monocrystalline state and an isolation layer 102 that is formed in the substrate 101 and defining active regions 103. Each of the active region 103 may include a plurality of protruded active regions, and the upper portion of each of the protruded active regions may have a pyramid shape. The protruded active regions may be disposed at the positions corresponding to the junction portion 120.

The substrate 101 may be or include a monocrystalline semiconductor substrate. The substrate 101 may include a silicon-containing material. In one implementation, the semiconductor substrate may include a monocrystalline silicon-containing material. For example, the substrate 101 may be or include a monocrystalline bulk silicon substrate or a Silicon On Insulator (SOI) substrate where a support substrate, a buried dielectric layer, and a monocrystalline silicon layer are sequentially stacked.

The surface (or the upper surface) of the monocrystalline substrate 101 may have a predetermined crystal plane that is described with Miller Indices. For example, the crystal plane of the substrate 101 may be a (100) plane. Herein, the crystal plane is also referred to as a lattice plane. The lattice plane indicates the plane determined by three lattice points not in a straight line among the lattice points that form a space lattice, and does not include other lattice points. The (100) plane of a silicon substrate is known for its excellent charge mobility in comparison with other crystal planes.

The isolation layer 102 that defines the active regions 103 may be formed, for example, through a Shallow Trench Isolation (STI) process. Therefore, the isolation layer 102 may include isolation trenches formed in the substrate 101 and a dielectric layer gap-filling the isolation trenches. The dielectric layer may include one or more layers including an oxide layer, a nitride layer, or an oxynitride layer. The active regions 103 defined by the isolation layer 102 may have a bar type or a line type having a long axis and a short axis. The protruded active regions having a pyramid-shaped upper portion in the active regions 103 may be of a pillar type.

The transistor in accordance with the implementation of the disclosed technology may include the buried gate 110 at least a portion of which is buried in the substrate 101. The buried gate 110 has a gate structure the entire or part of which is buried in the substrate 101. In an example, the buried gate 110 may include trenches 111 formed in the substrate 101, a gate dielectric layer 112 formed on the surface of the trenches 111, a gate electrode 113 gap-filling a portion of each trench 111 over the gate dielectric layer 112, and a gate sealing layer 114 gap-filling the remaining portion of each trench 111 over the gate electrode 113. The trenches 111 may be arranged to go across the active regions 103 and the isolation layer 102. The depth of the trenches 111 formed in the isolation layer 102 may be the same as or greater than the depth of the trenches 111 formed in the active regions 103. The gate dielectric layer 112 may be formed over the profile of the surface of the trenches 111 or on the surface of the trenches 111 corresponding to the gate electrode 113. The gate electrode 113 may include a metallic material, e.g., tungsten (W). The gate dielectric layer 112 and the gate sealing layer 114 may be or include a single layer including an oxide layer, a nitride layer, or an oxynitride layer, or a multi-layer including two or more of them.

The transistor in accordance with the implementation of the disclosed technology may include the junction portion 120 formed in the substrate 101 of the active regions 103 on both sides of the buried gate 110. The junction portion 120 may include a recess 121 formed in the substrate 101 of the active regions 103 on both sides of the buried gate 110. The recess 121 has a non-flat bottom surface, for example, having a protruding portion. With the protruding portion, the recess 121 has the pyramid shaped bottom surface 122.

The recess 121 has a bottom surface 122 that protrudes to form the pyramid shape and may decrease the contact resistance between an impurity region 123 and a contact pad 125 by increasing the contact area between the impurity region 123 and the contact pad 125. As the contact area between the impurity region 123 and the contact pad 125 decreases, the total resistance of the junction portion 120 may be reduced. In one example, the shape of pyramid includes a corn-shaped three-dimensional structure with a polygonal bottom surface and a triangular side. Therefore, the bottom surface 122 of the recess 121 formed in the bar-type or line-type active regions 103 may have a protrusion. In one implementation, the bottom surface 122 of the recess 121 may have a shape of rectangular pyramid.

The protruded bottom surface 122 of the recess 121 provides the rectangular pyramid shape to prevent a defect including lattice damage caused during an ion implantation process from not being cured but remaining in an impurity ion implantation process and the process of forming the impurity region 123 including the annealing process. For example, the bottom surface 122 of the recess 121 corresponding to the sides of the rectangular pyramid shape may not include a crystal plane having the greatest surface density (atoms/cm$^2$) based on the crystal plane of the surface of the substrate 101. In short, the bottom surface 122 of the recess 121 may have the protruded pyramid shape as the crystal plane having the greatest surface density (atoms/cm$^2$) is excluded. For example, when the crystal plane of the surface of the substrate 101 is a (100) plane, the crystal plane having the greatest surface density (atoms/cm$^2$) is a (111)

plane, and the crystal plane of the bottom surface 122 of the recess 121 does not include the (111) plane. Since the (111) plane has a greater surface density than other crystal planes in the silicon substrate 101, it is known to have a relatively poor physical or electrical characteristics.

The transistor in accordance with one implementation of the disclosed technology may include the junction portion 120 formed in the substrate 101 of the active regions 103 on both sides of the buried gate 110. The junction portion 120 may include the impurity region 123 formed in the substrate 101 under the recess 121, an ohmic contact 124 formed under the bottom surface 122 of the recess 121, and the contact pad 125 formed over the ohmic contact 124 to gap-fill the recess 121. The impurity region 123 formed in the substrate 101 and under the recess 121 may be formed by ion-implanting an N-type impurity such as arsenic (As) or phosphorus (P) or a P-type impurity such as boron (B) into the substrate 101. The impurity region 123 may have a geometrical shape formed depending on the shape (or step height) of the bottom surface 122 of the recess 121. In addition, the impurity region 123 may have a predetermined thickness (or depth) based on the bottom surface 122 of the recess 121. For example, the impurity region corresponding to the pyramid shape of the bottom surface 122 may be of a funnel shape. The impurity region 123 which is formed based on the shape of the bottom surface 122 of the recess 121 to have a predetermined thickness may have a portion of its edge overlapping with the gate electrode 113 in a direction orthogonal to the surface of the substrate 101. The impurity region 123 disposed at the center of the junction portion 120 in the horizontal direction does not overlap with the gate electrode 113 in the direction orthogonal to the surface of the substrate 101, and a portion of the impurity region 123 disposed at the edge of the junction portion 120 may overlap with the gate electrode 113 in the direction orthogonal to the surface of the substrate 101. In this way, it is possible to prevent deterioration of the characteristics caused by the electric field between the gate electrode 113 and the impurity region 123. When the bottom surface 122 of the recess 121 is planar, the entire impurity region 123 including the center and the edge of the junction portion 120 overlaps with the gate electrode 113. In one implementation of the disclosed technology, however, since the impurity region 123 has a portion of its edge overlapping with the gate electrode 113, the volume of the impurity region 123 overlapping with the gate electrode 113 can be reduced. Thus, it is possible to decrease the electric field between the impurity region 123 and the gate electrode 113, and obtain an effect similar to a case of adopting a Lightly Doped Drain (LDD) structure where the impurity region 123 includes a high concentration region and a low concentration region.

The ohmic contact 124 may function as a barrier for preventing the impurity from being diffused from the inside of the impurity region 123 to an external area while decreasing the contact resistance between the impurity region 123 and the contact pad 125. The ohmic contact 124 may further decrease the contact resistance between the impurity region 123 and the contact pad 125 as the recess 121 has the bottom surface 122 protruded in the pyramid shape. Therefore, the total resistance of the junction portion 120 may be further decreased. The ohmic contact 124 may include a metal silicide. The metal silicide may include a titanium silicide.

The contact pad 125 may reduce the total resistance of the junction portion 120 while obtaining contact margin, e.g., arrangement margin, between the junction portion 120 and a conductor (not shown, e.g., a plug) to be coupled with the junction portion 120 including the recess 121 having the bottom surface 122 protruded in a pyramid shape. The contact pad 125 may include a metallic layer. For example, the contact pad 125 may include a titanium nitride (TiN).

Since the transistor in accordance with the implementations of the disclosed technology includes the junction portion 120 including the recess 121 having the bottom surface 122 protruded with the pyramid shape, the impurity region 123 formed based on the shape of the bottom surface 122 of the recess 121, the ohmic contact 124, and the contact pad 125, the resistance of the source or drain of the transistor may be drastically decreased while having improved device reliability.

Hereafter, an exemplary method for fabricating the transistor shown in FIG. 2 is described with reference to FIGS. 3A to 3E. FIGS. 3A to 3E are cross-sectional views illustrating the method for fabricating the transistor shown taken along the A-A' line and the B-B' line shown in FIG. 1 in accordance with the implementation of the disclosed technology.

Figure 3A:
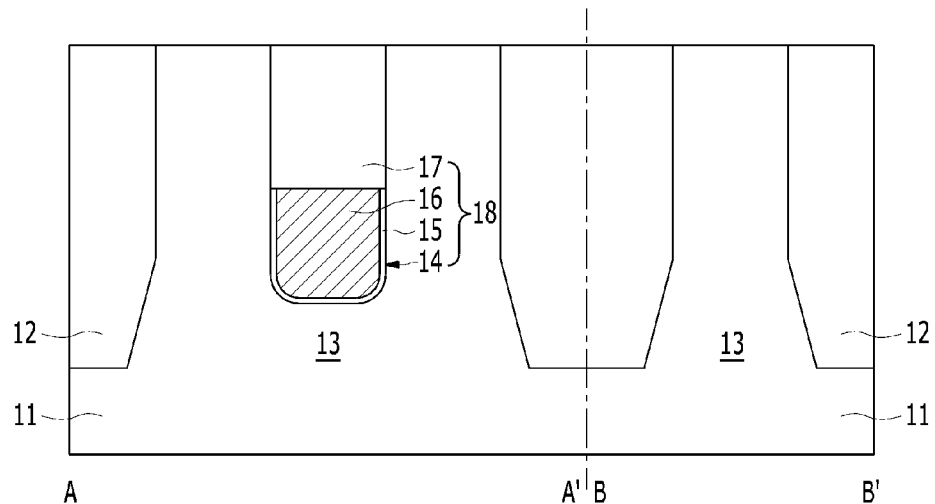
FIGS. 3A through 3E are cross-sectional views illustrating a method for fabricating the transistor of FIG. 2 in accordance with the implementation of the disclosed technology.

Referring to FIG. 3A, a substrate 11 of a monocrystalline state is provided. The substrate 11 may be or include a monocrystalline semiconductor substrate. The substrate 11 may include a silicon-containing material. In one example, the substrate 11 may be or include a monocrystalline silicon substrate. In one implementation, the substrate 11 may be or include a monocrystalline bulk silicon substrate, or a Silicon On Insulator (SOI) substrate where a support substrate, a buried dielectric layer, and a monocrystalline silicon layer are stacked.

The surface (or the upper surface) of the monocrystalline substrate 101 may have a predetermined crystal plane that is described with Miller Indices. For example, the crystal plane of the substrate 11 may be a (100) plane.

Subsequently, the isolation layer 12 that defines active regions 13 is formed. The isolation layer 12 may be formed, for example, through a Shallow Trench Isolation (STI) process. The STI process includes a series of processes for selectively etching the substrate 11 to form isolation trenches, and gap-filling the isolation trenches with a dielectric material. The active regions 13 defined by the isolation layer 12 may be formed in a bar type having a long axis and a short axis or a line type whose long axis is stretched in one direction.

Next, buried gates 18 are formed. Each of the buried gates 18 has a portion buried in the substrate 11. For example, the entire structure of the buried gates 18 may be buried in the substrate 11. Other implementations are also possible that only a portion of the buried gates 18 is buried in the substrate 11.

The buried gates 18 may be formed through a series of processes including selectively etching the substrate 11 to form trenches 14, forming a gate dielectric layer 15 on the surface of the trenches 14, forming gate electrodes 16 each of which gap-fills a portion of each trench 14, and forming a gate sealing layer 17 over the gate electrodes 16 to gap-fill the remaining portion of each trench 14. The trenches 14 may be formed by etching the active regions 13 and the isolation layer 12. Herein, the depth of the trenches 14 formed in the isolation layer 12 may be the same as or greater than the depth of the trenches 14 formed in the active regions 13. The gate electrodes 16 may be formed by depositing a conductive material over the profile of the substrate 11 and then performing a blanket etch process, e.g., an etch-back process. While the gate electrodes 16 are formed, a portion of the gate dielectric layer 15 may be etched. The gate electrodes 16 may include a metallic material, and the metallic material may include tungsten (W). The gate sealing layer 17 may be formed by depositing a dielectric material over the profile of the substrate 11 and then performing a planarization process, e.g., a Chemical Mechanical Polishing (CMP) process, until the surface of the substrate 11 is exposed. The gate dielectric layer 15 and the gate sealing layer 17 may be or include a single layer including an oxide layer, a nitride layer, or an oxynitride layer, or a multi-layer including two or more of them.

Figure 3B:
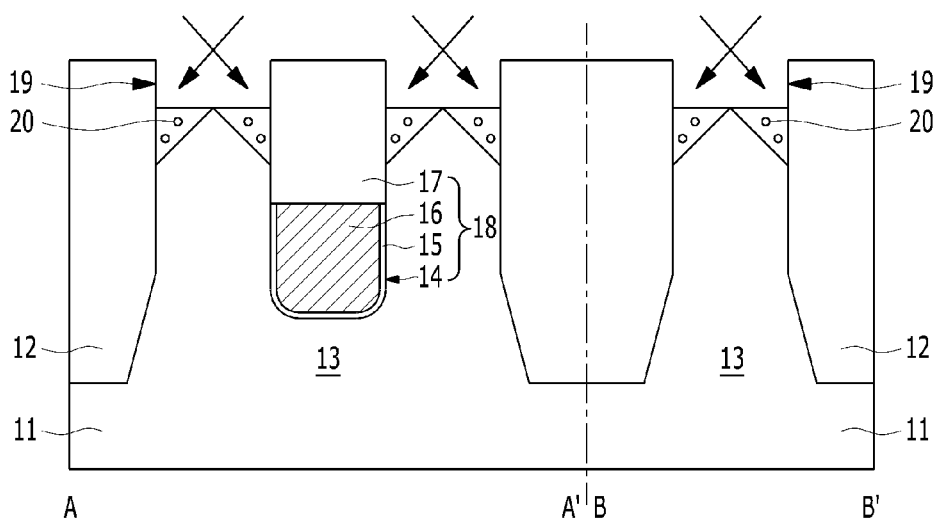

Referring to FIG. 3B, first recesses 19 are formed by etching the substrate 11 of the active regions 13 on both sides of each buried gate 18. The first recesses 19 enhance the contact margin, e.g., arrangement margin, between junction portions and plugs (not shown) which are to be formed over the junction portions. Further, the first recesses 19 provide a space where contact pads of the junction portions, which are sources/drains, are to be formed in the subsequent process. The bottom surface of each of the first recesses 19 may have the same crystal plane that is the same as the surface of the substrate 11. Therefore, the crystal plane of the bottom surface of each first recess 19 may be or include a (100) plane. The first recesses 19 may be formed through a dry etch process. For example, the first recesses 19 may be formed through an etch-back process. Herein, the isolation layer 12 and the gate sealing layer 17 may function as etch barriers.

Amorphous regions 20 are formed by repeatedly performing a tilted ion implantation process on the substrate 11 corresponding to the junction portions. The amorphous regions 20 may be used for forming a recess to have a bottom surface protruded in a pyramid shape. The junction portions in the substrate 11 may correspond to or include the bottom surfaces of the first recesses 19. The amorphous regions 20 may be a collection of crystal planes having the greatest surface density based on the crystal plane of the surface of the substrate 11. The angle of the ion implantation, the energy of the ion implantation, and the number of times that the ion implantation is performed during the tilted ion implantation process may be controlled according to the crystal plane of the surface of the substrate 11.

For example, when the crystal plane of the surface of the substrate 11 is a (100) plane, the crystal plane having the greatest surface density is a (111) plane. Therefore, the amorphous regions 20 may be the collection of the (111) crystal planes when the surface of the substrate 11 is seen vertically. In this case, the tilted ion implantation process may be performed four times in the front, back, right and left sides based on one direction (which is one horizontal direction) that is in parallel to the surface of the substrate 11, which are 90°, 180°, 270° and 360°. The tilted ion implantation process may be performed using argon (Ar), nitrogen (N), germanium (Ge), or carbon (C) at an ion implantation angle of approximately 5° to 40° with the ion implantation energy ranging from approximately 5 KeV to 20 KeV and a dose (atoms/cm$^2$) of approximately $1\times10^{15}$ to $5\times10^{15}$. Herein, the ion implantation angle is based on the normal that is perpendicular to the surface of the substrate 11.

Figure 3C:
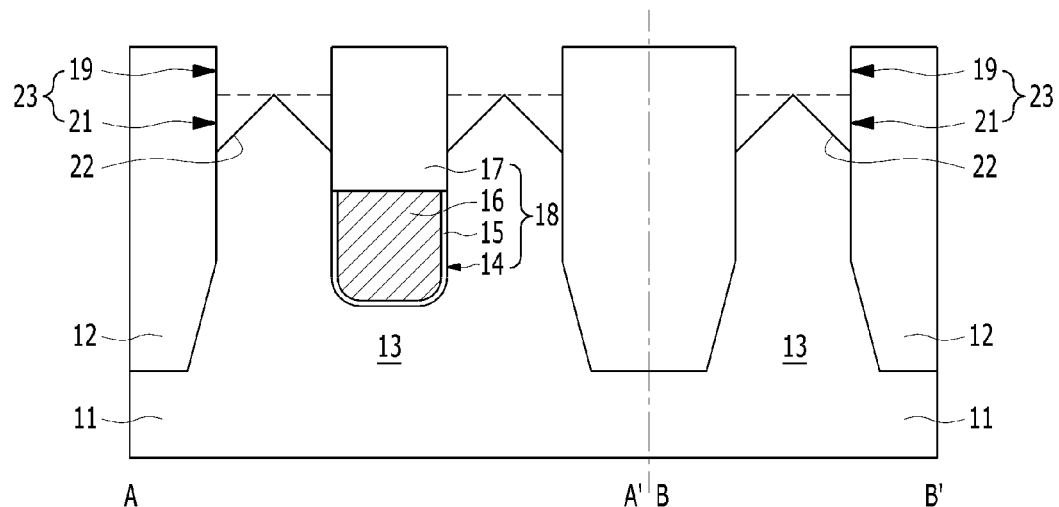

Referring to FIG. 3C, second recesses 21 are formed by removing the amorphous regions 20. The second recesses 21 formed by removing the amorphous regions 20 may have the bottom surface 22 protruded in a pyramid shape. Herein, since the amorphous regions 20 are removed, crystal planes having the greatest surface density may not exist in the area corresponding to the junction regions. For example, as the amorphous regions 20 are removed, when the crystal plane of the surface of the substrate 11 is the (100) plane, the (111) crystal planes having the greatest surface density may be excluded from the area corresponding to the junction regions. Therefore, the bottom surface 22 of the second recesses 21 may protrude to have a pyramid shape, and the crystal plane of the bottom surface 22 (which is the side of the pyramid shape) of the second recesses 21 does not include the (111) plane.

The amorphous regions 20 may be removed from the substrate 11 of the monocrystalline state through, for example, a wet etch process. Since the wet etch process is performed, it is possible to protect the substrate 11 and the surrounding structures from being unnecessarily damaged or prevent a defect from occurring in the substrate 11 and the surrounding structures in the process of forming the second recesses 21. The wet etch process may be performed using an ammonia ($NH_4OH+H_2O$)-based etchant.

Recesses 23 may be formed to include the first recesses 19 and the second recesses 21. The recesses 23 may be formed in the substrate 11 of the active regions 13 on both sides of each buried gate 18, and have bottom surface 22 protruded in a pyramid shape. The apexes of the pyramid shape may be disposed inside of the recesses 23.

Figure 3D:
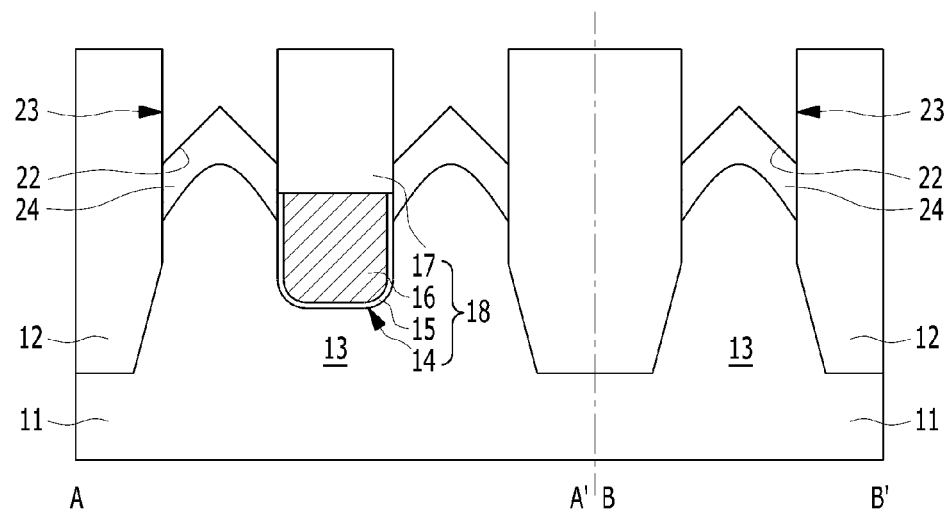

Referring to FIG. 3D, impurity regions 24 are formed in the substrate 11 and under the recesses 23 to have the bottom surface 22 protruded in a pyramid shape. The impurity regions 24 may be formed by sequentially performing an impurity ion implantation process and an annealing process.

During the impurity ion implantation process, an N-type impurity such as arsenic (As) or phosphorus (P) or a P-type impurity such as boron (B) may be used as the impurity. The impurity may be implanted perpendicular to the surface of the substrate 11. Therefore, the impurity regions 24 may have a geometrical shape formed based on the shape (or step height) of the bottom surface 22 of the recesses 23. In addition, the impurity regions 24 may have a predetermined thickness (or depth) based on the bottom surface 22 of the recesses 23. For example, the impurity regions 24 may have a funnel shape. The impurity regions 24 formed based on the shape of the bottom surface 22 of the recesses 23 may have a portion of its edge overlapping with the gate electrodes 16 in a direction parallel to the surface of the substrate 11 (which is a horizontal direction). Since a portion of the edge of the impurity regions 24 in accordance with the implementations of the disclosed technology overlaps with the gate electrodes 16, the volume of the impurity regions 24 overlapping with the gate electrodes 16 may be reduced. In this way, it is possible to improve deterioration of characteristics caused by the electric field between the impurity regions 24 and the gate electrodes 16.

For example, the impurity ion implantation process may be performed using an N-type impurity such as phosphorus (P) or arsenic (As) with the ion implantation energy ranging from approximately 5 KeV to 20 KeV and a dose (atoms/cm$^2$) of approximately $1\times10^{15}$ to $1\times10^{16}$.

The annealing process performed after the impurity ion implantation process treats the defect of the substrate 11 including lattice damage that occurs during the impurity ion implantation process and activates the implanted impurity. In one implementation, the annealing process may be performed using a Rapid Thermal Process (RTP). Herein, since the bottom surface 22 of the recesses 23 does not include the crystal plane having the greatest surface density in relation to Miller indices notation of the crystal plane of the surface of the substrate 11, the defect occurred during the annealing process may be effectively cured. Thus, it is possible to treat the defect not to be remained during the annealing process.

Herein, when the bottom surface 22 of the recesses 23 is the same as the crystal plane of the surface of the substrate 11, which is a (100) plane, the impurity regions 24 include a (111) plane. Since the (111) plane inside the impurity regions 24 has a greater surface density than the other crystal planes during the annealing process, the speed of recrystallization is so slow that the defects are not cured within a limited time but frequently remain after the annealing. Also, the defects not cured during the annealing process expand during the subsequent process and cause to deteriorate the device characteristics.

On the contrary, the transistor in accordance with the implementation of the disclosed technology has a pyramid-shaped bottom surface 22 of the recesses 23 and the crystal plane of the bottom surface 22 of the recesses 23 corresponding to the side of the pyramid does not include a (111) plane. Thus, it is possible to cure defects not to be remained during the annealing process.

Meanwhile, although the crystal plane of the bottom surface 22 of the recesses 23 does not include the (111) plane, the impurity regions 24 formed based on the shape of the bottom surface 22 of the recesses 23 may include the (111) plane. However, it is possible to cure the defects within a limited time during the annealing process and improve the device characteristics because the volume occupied by the (111) plane in the impurity regions 24 is much smaller than that of the case where the bottom surface 22 of the recesses 23 is the same as the crystal plane of the surface of the substrate 11.

Figure 3E:
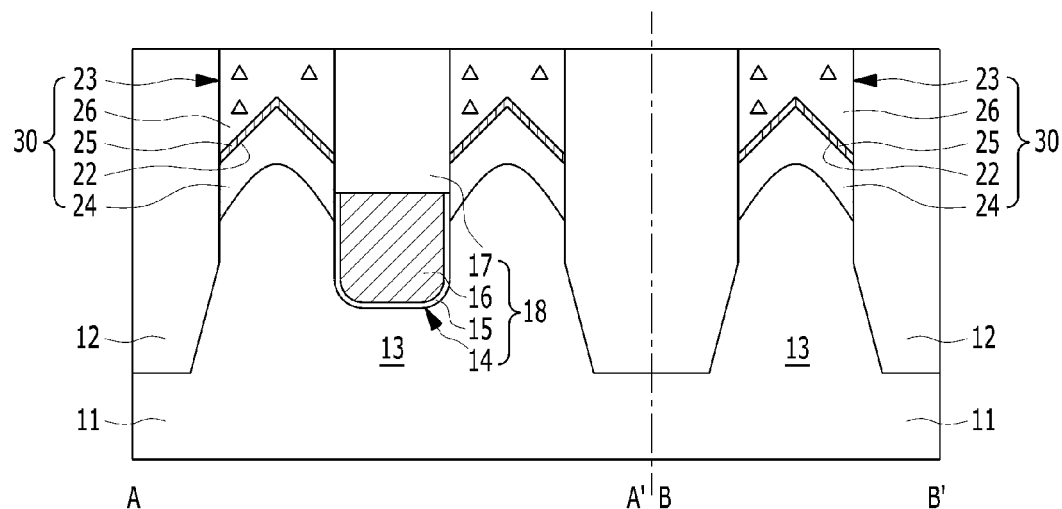

Referring to FIG. 3E, ohmic contacts 25 are formed on the bottom surface 22 of the recesses 23. The ohmic contacts 25 may decrease the contact resistance between the impurity regions 24 and contact pads 26, which are to be formed in the subsequent process. The ohmic contacts 25 may also function as a barrier that prevents external diffusion of the impurity of the impurity regions 24 during the subsequent process. The ohmic contacts 25 may include a metal silicide. The metal silicide may include a titanium silicide. The ohmic contacts 25 may be formed through a series of processes including forming a metal layer over the surface of the substrate structure including the recesses 23, performing an annealing process so as to form a metal silicide over the bottom surface 22 of the recesses 23, and then removing the metal layer that remains without participating any reactions.

Subsequently, the contact pads 26 are formed over the ohmic contacts 25. The contact pads 26 may be formed of or include a metallic layer. The contact pads 26 may be formed by forming a metallic layer over the profile of the substrate structure including the recesses 23 and performing a planarization process until the surface of the substrate 11 is exposed. The planarization process may be or include a Chemical Mechanical Polishing (CMP) process.

As a result, junction portions 30 are formed to include the recesses 23, the impurity regions 24, the contact pads 26 and the ohmic contacts 25. The recesses 23 are formed in the substrate 11 and on both sides of each of the buried gates 18 to have the protruding bottom surface 22 with a pyramid shape. The impurity regions 24 are formed in the substrate 11 and under the recesses 23 based on the configuration of the bottom surface 22 of the recesses 23. The contact pads 26 gap-fill the recesses 23, and the ohmic contacts 25 are interposed between the impurity regions 24 and the contact pads 26.

The transistor in accordance with the implementation of the disclosed technology may be applied to diverse electronic devices including semiconductor memories. For example, a semiconductor memory may include a cell array where a plurality of memory cells for storing data are arranged. Each of the memory cells may include a memory element for stroing data and a selection element for controlling the access to the memory element. The transistor in accordance with the implementation of the disclosed technology may be used as the selection element. For example, the transistor in accordance with the implementation of the disclosed technology may be used for a semiconductor memory for sensing a change in resistance.

The semiconductor memory for sensing a change in resistance may use a variable resistance element as a memory element. The variable resistance element may switch between different resistance states in response to a bias (e.g., current or voltage) that is applied to the variable resistance element. The variable resistance element may include a variable resistance material that is used as a resistive memory in which the programming and erasing of a data are performed based on a change of resistance characteristics. The variable resistance material may include diverse materials that are used for an RRAM (resistive random access memory), a PRAM (phase change random access memory), an FRAM (ferroelectric random access memory), an MRAM (magnetic random access memory), an STTRAM (spin transfer torque random access memory) and the like. For example, the variable resistance material may include a ferromagnetic material, a transition metal oxide, a metal oxide including a perovskite-based material, a phase-change material including a chalcogenide-based material, or a ferroelectric material and so on.

Figure 4:
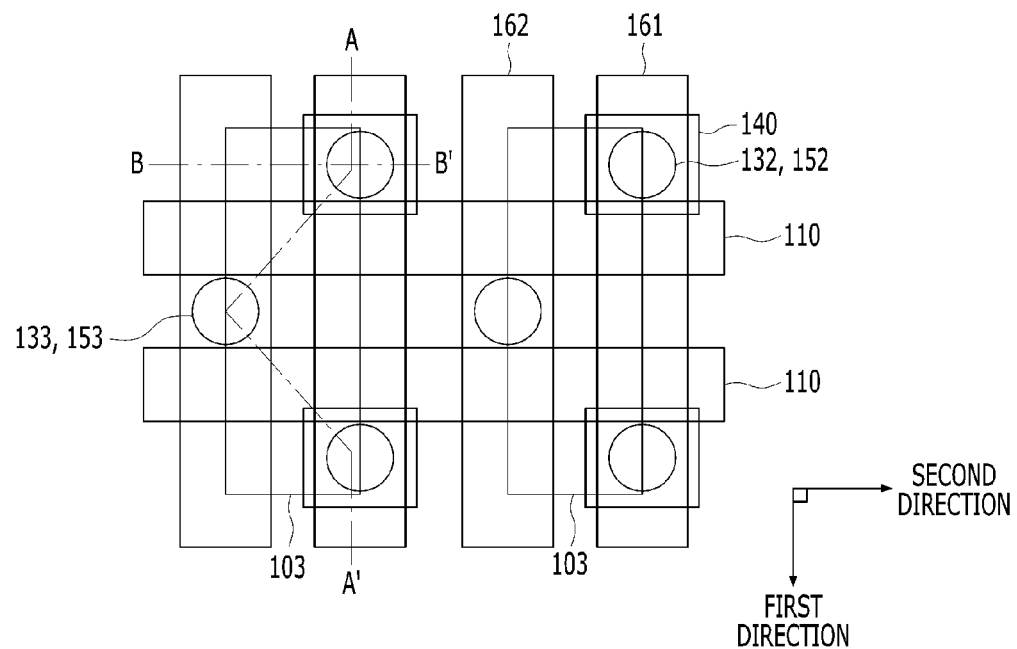
FIG. 4 is a plan view of a semiconductor memory including the transistor in accordance with an implementation of the disclosed technology.
Figure 5:
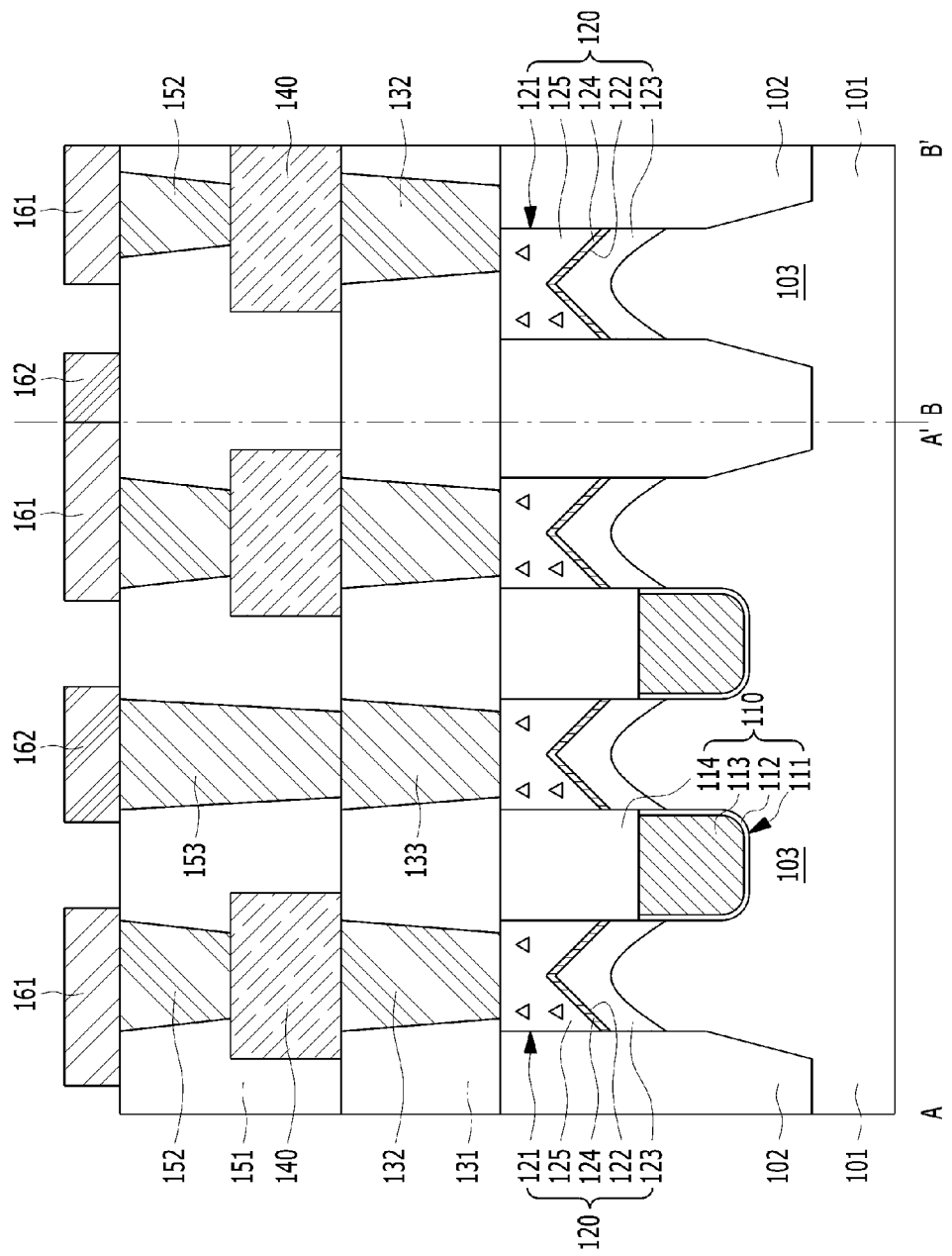
FIG. 5 is a cross-sectional view of the semiconductor memory including the transistor in accordance with the implementation of the disclosed technology.

Hereafter, a semiconductor memory including the transistor in accordance with the implementation of the present disclosure is described with reference to FIGS. 4 and 5. FIG. 4 is a plan view of a semiconductor memory including the transistor in accordance with the implementation of the present disclosure. FIG. 5 is a cross-sectional view of the semiconductor memory including the transistor in accordance with the implementation of the present disclosure taken along the A-A' line and the B-B' line shown in FIG. 4. Herein, for the sake of convenience, the shape of the bottom surface of the recesses does not coincide with the A-A' line and the B-B' line shown in FIG. 4.

Referring to FIGS. 4 and 5, the semiconductor memory in accordance with the implementation of the present disclosure may include a plurality of transistors each of which includes an isolation layer 102 formed in a substrate 101 of a monocrystalline state and defining a plurality of active regions 103, a buried gate 110 a portion of which is buried in the substrate 101, and a junction portion 120. The substrate 101 of a monocrystalline state may include a silicon-containing material. The isolation layer 102 may be formed through, for example, a Shallow Trench Isolation (STI) process. Each of the active regions 103 individually has a long axis and a short axis, and the active regions 103 may be formed in a line type where the long axis is extended in a first direction, and a plurality of the active regions 103 may be disposed to be spaced apart from each other in a second direction that intersects with the first direction. The transistors may be provided in accordance with the implementation of the present disclosure. For example, the buried gate 110 may include line-type trenches 111 extended in the second direction to interact with the active regions 103 and the isolation layer 102, a gate dielectric layer 112 formed on the surface of each of the trenches 111, a gate electrode 113 gap-filling a portion of each of the trenches 111, and a gate sealing layer 114 gap-filling the remaining portion of each of the trenches 111. The gate electrode 113 may function as a word line. A plurality of transistors may be disposed in each of the active regions 103, and the neighboring transistors may share one junction portion 120. The junction portion 120 may include a recess 121 having the bottom surface 122 protruded in a pyramid shape, an impurity region 123 formed in the substrate 101 and under the recess 121, an ohmic contact 124 disposed over the bottom surface 122 of the recess 121, and a contact pad 125 gap-filling the recess 121 over the ohmic contact 124. Since the transistor having the buried gate 110 and the junction portion 120 is already described in detail above, the detailed description isomitted herein.

The semiconductor memory in accordance with the implementation of the present disclosure may include a first inter-layer dielectric layer 131 formed over the substrate 101, first plugs 132 penetrating through the first inter-layer dielectric layer 131 and coupled with the junction portions 120 on both sides of each of the active regions 103, and second plugs 133 coupled with the junction portions 120 between the buried gates 110. The first inter-layer dielectric layer 131 may be or include a single layer including an oxide layer, a nitride layer, or an oxynitride layer, or a multi-layer of two or more of them. The first plugs 132 in the second direction may be eccentrically disposed to one side of each of the active regions 103, and the second plugs 133 may be eccentrically disposed to the other side of each of the active regions 103. Herein, the contact pads 125 of the junction portions 120 enable to secure contact margin between the first plugs 132 and the second plugs 133.

Also, the semiconductor memory in accordance with the implementation of the present disclosure may include variable resistance elements 140 contacting the first plugs 132 over the first inter-layer dielectric layer 131, a second inter-layer dielectric layer 151 formed over the first inter-layer dielectric layer 131 and including the variable resistance elements 140, third plugs 152 penetrating through the second inter-layer dielectric layer 151 and contacting the variable resistance elements 140, and fourth plugs 153 penetrating through the second inter-layer dielectric layer 151 and contacting the second plugs 133. The second inter-layer dielectric layer 151 may be or include a single layer including an oxide layer, a nitride layer, and an oxynitride layer, or a multi-layer of two or more of them. The variable resistance elements 140 may switch between different resistance states in response to a bias (e.g., current or voltage) that is applied to the variable resistance elements. The variable resistance elements 140 may include a magnetic tunnel junction (MTJ) where a tunnel barrier is interposed between two magnetic materials such as a metal oxide, a phase-change material, or a ferroelectric material and the like.

The semiconductor memory in accordance with the implementation of the present disclosure may include first conductive lines 161 and second conductive lines 162 that are formed over the second inter-layer dielectric layer 151 to respectively contact the third plugs 152 and the fourth plugs 153. The first conductive lines 161 may correspond to bit lines, and the second conductive lines 162 may correspond to source lines. The second plugs 133 and the fourth plugs 153 coupled with the second conductive lines 162 may correspond to source line contacts. The first conductive lines 161 and the second conductive lines 162 may have patterns of a line type extended in the first direction, and the first conductive lines 161 and the second conductive lines 162 may be alternately disposed to be spaced apart from each other in the second direction.

Since the semiconductor memory described above includes the junction portions 120 having a low resistance as selection elements, the semiconductor memory that senses a change in the resistance may have improved operation characteristics and reliability.

The transistor in accordance with the implementation of the present disclosure and the semiconductor memory including the transistor may be applied to diverse electronic devices or systems. FIGS. 6 to 10 show examples of the electronic devices or systems that may be realized using the transistor in accordance with the implementation of the present disclosure and the semiconductor memory including the transistor.

Figure 6:
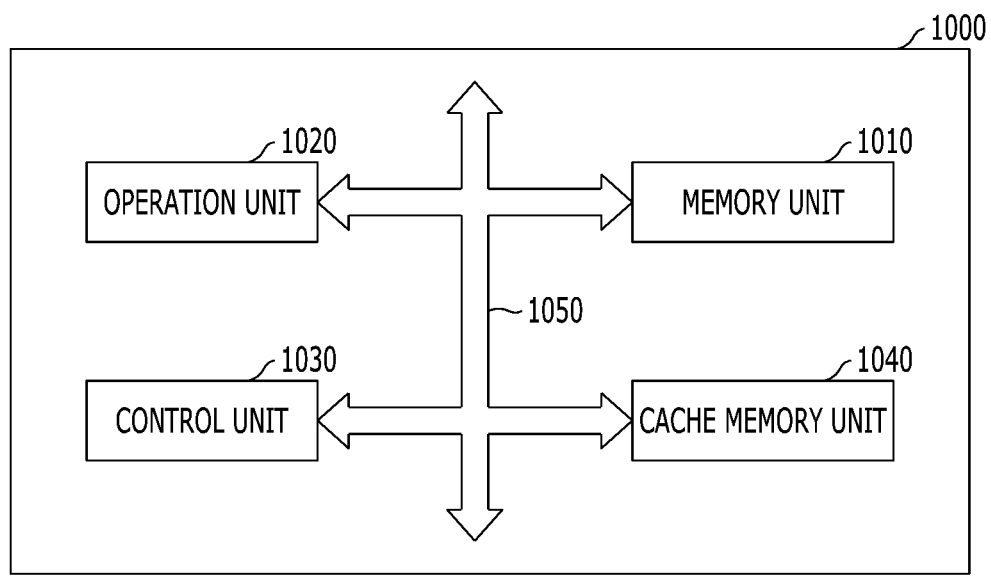
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. The memory unit 1010 may include a gate having at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate under the recess; and a contact pad gap-filling the recess. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
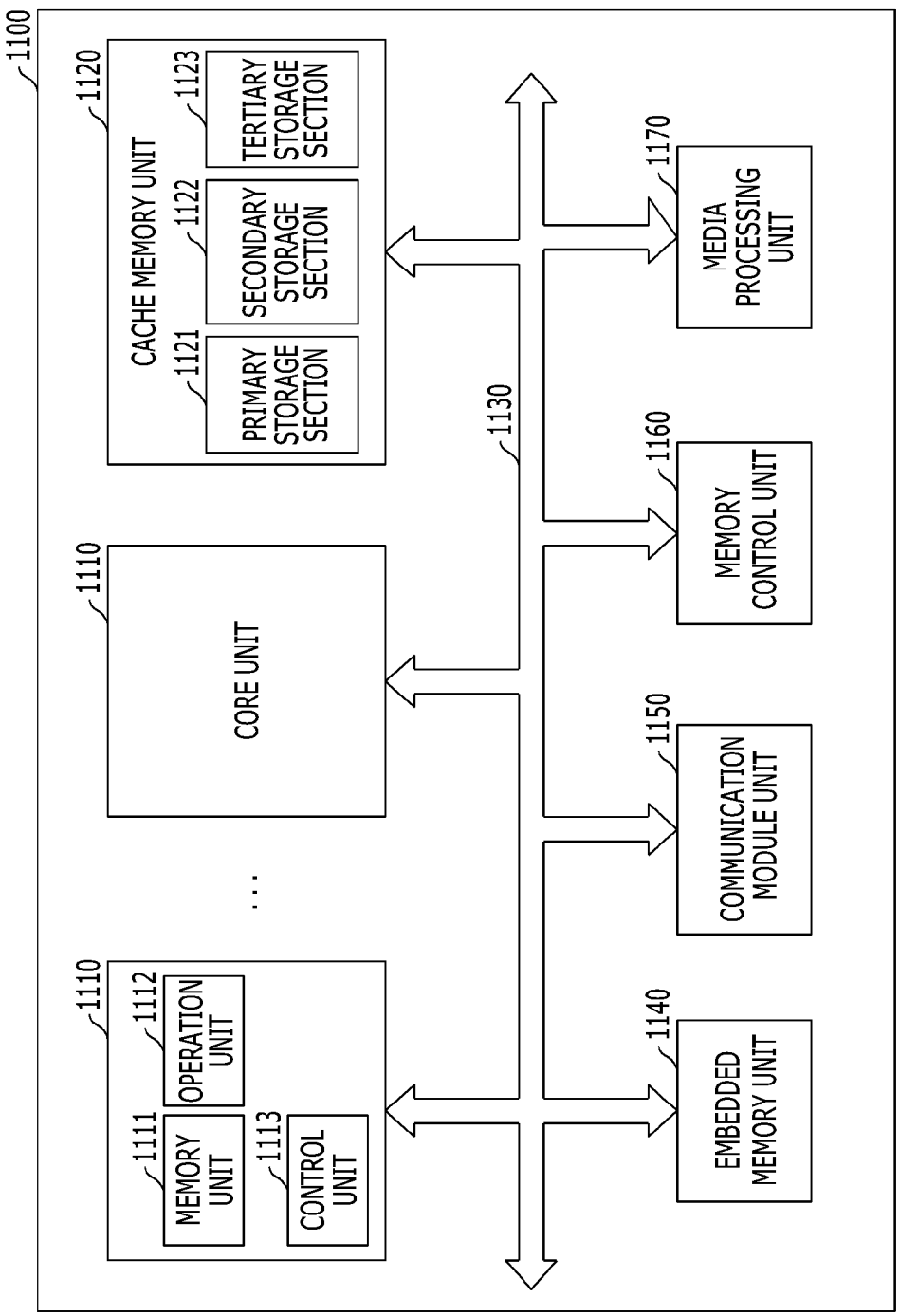
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a gate having at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate under the recess; and a contact pad gap-filling the recess. Through this, the cache memory unit 1120 and the processor 1100 may have improved reliability.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
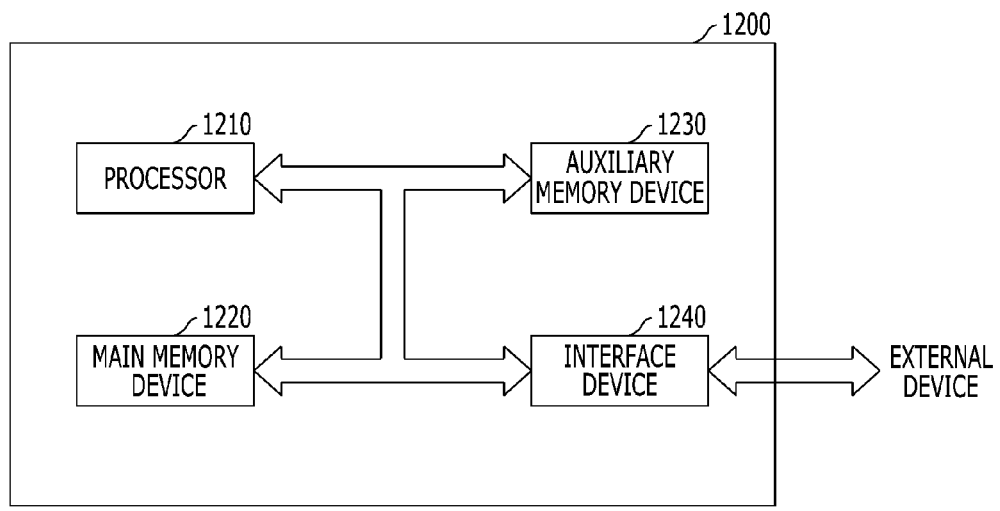
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a gate having at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate under the recess; and a contact pad gap-filling the recess. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a gate having at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate under the recess; and a contact pad gap-filling the recess. Through this, the auxiliary memory device 1230 and the system 1200 may have improved reliability.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
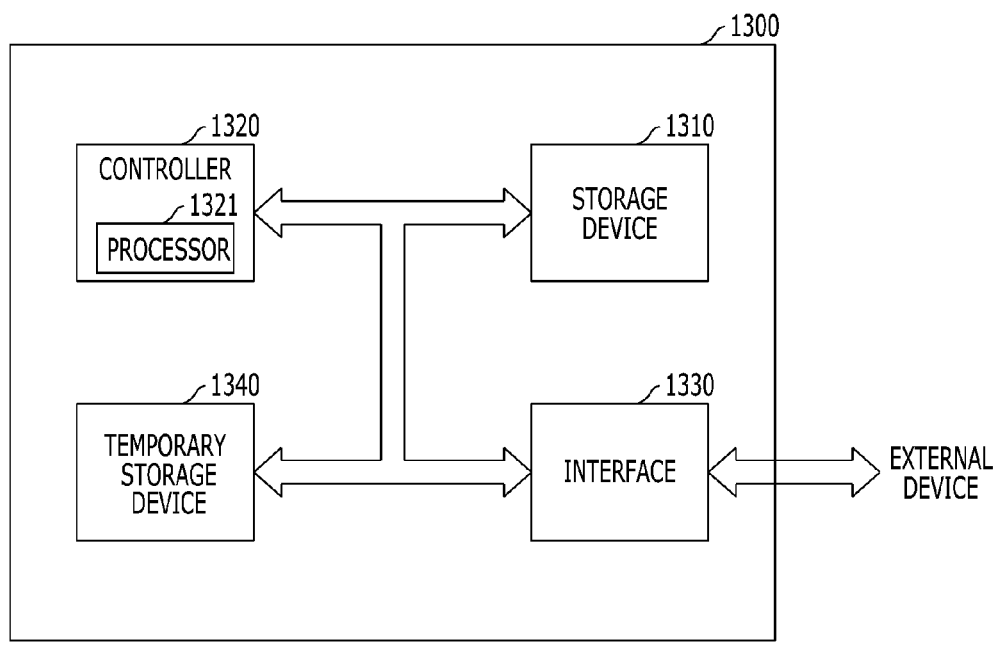
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a gate having at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate under the recess; and a contact pad gap-filling the recess. Through this, the temporary storage device 1340 and the data storage system 1300 may have improved reliability.

Figure 10:
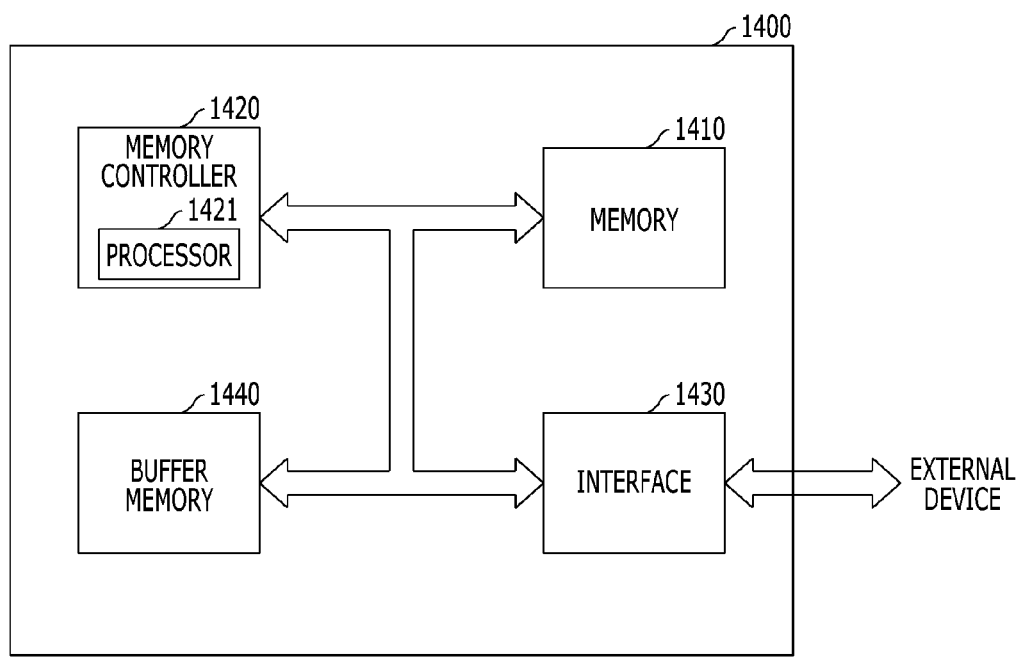
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a gate having at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate under the recess; and a contact pad gap-filling the recess. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include a gate having at least a portion buried in a substrate; a junction portion formed in the substrate on both sides of the gate; and a memory element coupled with the junction portion on one side of the gate, wherein the junction portion includes: a recess having a bottom surface protruded in a pyramid shape; an impurity region formed in the substrate under the recess; and a contact pad gap-filling the recess. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6 to 10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device comprising a semiconductor memory unit that comprises:
　a substrate having an upper surface protruded in a pyramid shape and a bottom surface;
　a gate including at least a portion buried in the substrate;
　a junction portion formed on both sides of the gate; and
　a memory element coupled with the junction portion on one side of the gate,
　wherein the junction portion comprises:
　　an impurity region formed to include a pyramid shaped bottom surface along the upper surface of the substrate; and
　　a contact pad formed over the impurity region,
　wherein the gate includes:
　　a trench that is formed in the substrate; and
　　a gate electrode that fills a portion of the trench, and
　wherein the impurity region has an edge portion overlapping with the gate electrode in a direction orthogonal to the bottom surface of the substrate and a center portion with the lowest part not overlapping with the gate electrode in the direction.

2. The electronic device according to claim 1, wherein the junction portion further comprises:
　an ohmic contact interposed between the impurity region and the contact pad.

3. The electronic device according to claim 1, wherein the gate includes:
a trench that is formed in the substrate;
a gate dielectric layer formed on a surface of the trench;
a gate electrode that fills a portion of the trench over the gate dielectric layer; and
a gate sealing layer that fills a remaining portion of the trench over the gate electrode.

4. The electronic device according to claim 3, wherein the impurity region has an edge having a portion that overlaps with the gate electrode.

5. The electronic device according to claim 1, wherein:
the substrate includes a semiconductor substrate of a monocrystalline state.

6. The electronic device according to claim 5, wherein:
the substrate includes a monocrystalline silicon having a surface of a crystal plane of a (100) plane, and
the crystal plane having a greatest surface density in the monocrystalline silicon is (111) plane.

7. The electronic device according to claim 1, wherein the impurity region has a predetermined thickness from the contact pad.

8. The electronic device according to claim 1, wherein the impurity region has a shape of a funnel.

9. The electronic device according to claim 1, wherein the memory element includes a variable resistance element that switches between different resistance states according to a voltage or current applied to the variable resistance element.

10. The electronic device according to claim 9, wherein the variable resistance element includes a Magnetic Tunnel Junction (MTJ) where a tunnel barrier is interposed between two magnetic materials.

11. The electronic device according to claim 9, wherein the variable resistance element includes a metal oxide, a phase-change material, or a ferroelectric material.

12. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the memory element is part of the cache memory unit in the processor.

13. A transistor, comprising:
a substrate including a plurality of active regions, each active region including an upper surface that protrudes in a pyramid shape and a bottom surface;
gates each including at least a portion buried in the substrate and formed between the active regions;
impurity regions each formed over the protruded upper portions of the active regions; and
contact pads formed over the impurity regions,
wherein each of the gates includes:
a trench formed in the substrate and between the active regions;
a gate electrode for gap-filling a portion of each trench; and
wherein the impurity region has an edge portion overlapping with the gate electrode in a direction orthogonal to the bottom surface of the substrate and a middle portion not overlapping with the gate electrode in the direction.

14. The transistor according to claim 13, further comprising:
ohmic contacts interposed between the contact pads and the impurity regions.

15. The transistor according to claim 13, wherein each of the gates includes:
a gate dielectric layer formed on a surface of each of trenches that are formed in the substrate and between the active regions;
a gate electrode for gap-filling a portion of each trench over the gate dielectric layer; and
a gate sealing layer for gap-filling a remaining portion of each trench over the gate electrode.

16. The transistor according to claim 15, wherein the impurity region has an edge of which a portion overlaps with the gate and a center of which is not overlapped with the gate.

17. The transistor according to claim 13, wherein:
the substrate includes a semiconductor substrate including a monocrystalline state.

18. The transistor according to claim 17, wherein:
the substrate includes a monocrystalline silicon having a surface of a crystal plane of a (100) plane, and
the crystal plane having a greatest surface density in the monocrystalline silicon includes (111) plane.

19. The transistor according to claim 13, wherein the impurity region has a predetermined thickness from the contact pads.

20. The transistor according to claim 13, wherein the impurity region has a shape of a funnel.

* * * * *